United States Patent [19]

Rolfe

[11] Patent Number: 4,912,710
[45] Date of Patent: Mar. 27, 1990

[54] SELF-CHECKING RANDOM ACCESS MEMORY

[75] Inventor: Robert M. Rolfe, Melbourne, Fla.

[73] Assignee: Harris Corporation, Melbourne, Fla.

[21] Appl. No.: 161,703

[22] Filed: Feb. 29, 1988

[51] Int. Cl.⁴ .......................................... G11C 29/00
[52] U.S. Cl. ................................. 371/71; 371/21.1
[58] Field of Search ................. 371/21, 67, 68, 71, 371/21.1

[56] References Cited

U.S. PATENT DOCUMENTS 3,008,129 11/1961 Katz ........................................ 371/71
3,049,692 8/1962 Hunt ....................................... 371/71
3,751,649 8/1973 Hart, Jr. ................................. 371/71
3,940,601 2/1976 Henry et al. .......................... 371/71
4,667,330 5/1987 Kumagai ............................... 371/71

Primary Examiner—Charles E. Atkinson
Attorney, Agent, or Firm—John L. DeAngelis, Jr.

[57] ABSTRACT

A random access memory including address error checking. The random access memory includes an address decoder that activates data cells from among the plurality of data cells in the memory. The random access memory also includes an address encoder that supplies an address determined by the data cells activated. The address from the encoder is compared with the address input to the decoder and if the two address are different an error indication is provided.

5 Claims, 1 Drawing Sheet

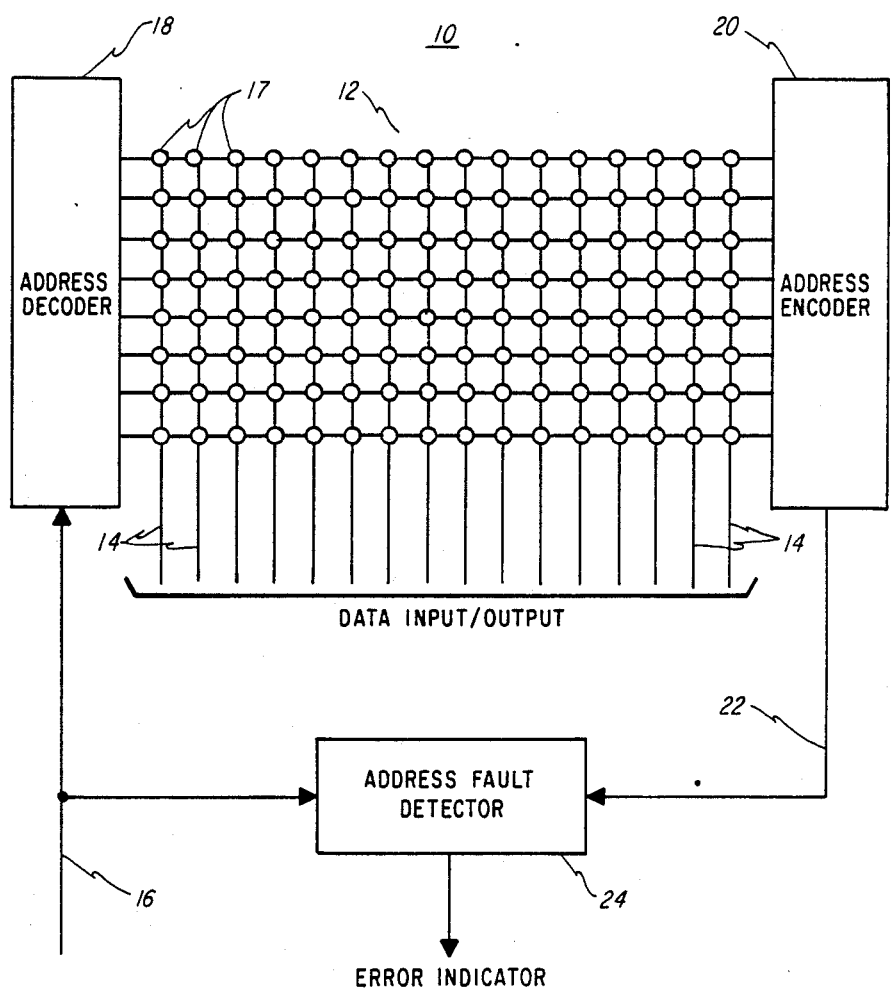

SELF-CHECKING RANDOM ACCESS MEMORY

FIELD OF THE INVENTION

This invention relates to the detection of address errors in a random access memory.

BACKGROUND OF THE INVENTION

In the manufacture of very large addressable memories, it is possible that defective regions, including shorts or opens, will appear. For proper use of the memory it is important to detect these defects, whether they be associated with the address lines or data lines, and compensate for them so they do not have an adverse impact on memory operation.

Present random access memory (RAM) architectures provide for data checking either internally or externally with a parity scheme or a higher-order code redundancy technique. These techniques involve adding additional bits to the data word, which can be used to identify, and in some cases correct, errors in the data word. In one such scheme, as the data is read into memory the data bits are also fed into a code generator that produces the additional data bits (or check bits) for error detection and correction. Later, when the data is read from memory the data bits and the appended check bits are input to a code checker. The code checker decodes the check bits and compares the result with the data bits for identification, and in some cases correction, of errors in the data bits.

This data checking system focused on the data words, cannot detect address-related failures. If there is a short, open, or other fault in the address bus structure interconnections or in the individual random access memory microcircuits the code checker described above will not detect it, because data, either correct or incorrect, can be written into or read from the wrong address location with no change in the data itself. Because these address-related defects are reproducible each data read or data write cycle, data could have been written into or read from an incorrect address during execution of a software program.

There is one well known test that can be used during the manufacturing process to locate address-dependent memory failures. This test called address data storage mapping, proceeds as follows:

Step a. Write a unique algorithmically-derived data value to every address.

Step b. Read every address for the unique data value of step a.

Step c. Select a single address, write a different algorithmically-derived unique data value into it (guaranteed different from step a or b).

Step d. Read the address selected in step c to confirm that the unique data from step c is present.

Step e. Read every address to confirm that the unique value from step a remained in every cell, except the step c. selected address.

step f. Repeat steps a through d for every unique address in the address space of the RAM.

This prior art test is an example of a a N2 test where there are N unique address elements in the RAM such that test execution requires N2 read operations to the RAM. As memory size increases, the address data storage mapping technique takes progressively longer to find defective address locations. After the address data storage mapping test has identified "bad" address locations, the address decoding mechanism is modified so that data intended for storage at any of the defective cells is rerouted to a good address location. As is well known, this test has certain limitations. The test cannot identify faults that occur only during operational address utilization (including intermittent faults); it is a static test that is inherently limited to off-line use.

SUMMARY OF THE INVENTION

It is an objective of the present invention to provide a concurrent memory test can locate address circuit faults. It is a further objective to accomplish this memory address fault detection during each memory access cycle, in addition to existing coding techniques used for data error detection and correction.

The present invention provides a bottom-up address fault detection scheme rather than the prior art systems top-down approach. Thus the present invention is usable in a variety of applications, including during operation and during the manufacturing process, especially for high-reliability random access memories. The present invention provides a physical mapping of address bus errors, rather than simply the address data storage mapping described in the prior art.

The present invention probes the addressing structure for each random access memory cell (a cell is a single memory bit of a semiconductor random access memory) and reports on the electrical performance of the address decoding structure for each cell. The result is true topological information that is not in any way deduced from stored data. The concurrent checking of each cell occurs on each read cycle, and thus both static and transient errors can be detected.

The present invention, which operates concurrently with random access memory operation, includes an address decoder that selects the address location in the random access memory. The present invention also includes an address encoder (error generator) that encodes the selected address location. The encoded selected address location is compared with the requested address location and an error is indicated if the two are not identical. Thus the present invention provides a scheme for directly encoding the selected address for comparison with the requested address to generate an error signal.

BRIEF DESCRIPTION OF THE DRAWING

The present invention can be more easily understood, and the further advantages and uses thereof more readily apparent, when considered in view of the description of the preferred embodiments and the FIGURE, which depicts a preferred embodiment of the present invention.

DESCRIPTION OF THE PREFERRED EMBODIMENTS

The objective of the present invention is to provide an address signature that is returned with each address access to a random access memory. The signature is generated by the microcircuit physical topology, i.e., the actual random access memory and its associated cells, for comparison with the requested address. When the return address signature and the requested address are not identical, an error has occurred in the address lines of the memory. This address error check, together with the known data error checking techniques, provides a completely self-checking memory without requiring any off-line (non-concurrent) address testing.

The FIGURE is a random acccess memory 10 constructed according to the teachings of the present invention. The random access memory 10 includes a cell array 12 and a plurality of data input/output lines 14. When operating in a computer or a microprocessor-based device, a requested address is present on an address bus 16 for selecting a data word (comprising a plurality of data cells 17) in the data cell array 12. An address decoder 18 decodes the requested address to either read the word at the requested address from the data cell array 12 or write a word to the requested address. If there are defects in the data cell array 12 the data cells (constituting a data word) that are actually selected may not be the data cells requested by the requested address. That is, if there is a defect in the data cell array 12 the word may be read from (or into) an incorrect address. Further, some defects may cause more than one data word to be selected. In the FIGURE, the data word is a sixteen bit word that is present on the data input/output lines 14 in accord with the selected address from the address decoder 18. However, it is well-known by those skilled in the art that any size data cell array and any bit-length word can be used in the present invention. It is also well-known that the address decoder 18 (and the address encoder 20) comprises a plurality of gates that monitor the address bus 16 and select the proper cells in the data cell array 12 that data is to be read into or from. The objective of the present invention is to determine when a data word has been read from or written to the wrong address.

For the physical topology of the random access memory 10 to identify such address faults, an address encoder 20 is included on the output side of the data cell array 12, opposite the address decoder 18. The address encoder 20 generates a signal representing the actual address from which the word was read or written to. This selected address is placed on an address bus 22. If, for any reason, including a defect in the memory cell array 12, more than one address is selected, the address encoder 18 will generate a plurality of signals equal to the number of data words activated by the requested address. The address encoder 20 uses the same scheme to generate the address from the selected data cell line that the address decoder 18 uses to select the proper data cell line.

Both the address buses 16 and 22 are connected to an address fault detector 24. The address fault detector 24 compares the requested address on the address bus 16 with the selected address on the address bus 22 and provides an error indication if there is not a match between these two input values. In this way, the invention determines if the word was read from or written to the correct address, i.e., the requested address.

As can now be seen, the major advantage offered by this invention is address error detection concurrent with data access, that requires no explicit test program executions. The invention can also be used in support of high-yield random access memories during the processing stage. In this case, when address defects are discovered, the address decoding and encoding scheme can be modified at the chip level to avoid the defective addresses. Note also that the address encoder 20 will detect not only the correct address based on the selected line of the data cell array 12, but will also detect whether any additional addresses have been selected in any of the parallel lines of the data cell array 12. The address encoder 20 and the address fault detector 24 will operate on each read cycle and each write cycle to ensure optimum detection of address defects.

In one embodiment, as mentioned above, the addressing encoder 20 uses the same scheme or digital logic for encoding the selected address as is used by the address decoder 18 to select the proper line. Another embodiment for the address encoder 20 includes a digital delay chain comprised of a plurality of latches. One latch is associated with each line of the data cell array 12. The latch associated with the selected line is set when that line is selected and after the read or access cycle is initiated the latches are shifted out by clocking to a binary counter. The binary counter counts the number of shift cycles required to shift the set bit out of the delay chain. The number of shift cycles is used to generate, either directly or using an algorithm, the address selected. As in the previous embodiment, the address fault detector 24 compares the encoded or selected address with the requested address on the address bus 16 and indicates an error if the two signals input thereto are not identical.

Although several embodiments in accordance with the present invention have been shown and described, it is understood that the same is not limited thereto but is susceptible of numerous changes and modifications as known to a person skilled in the art, and I therefore do not wish to be limited to the details shown and described herein, but intend to cover all such changes and modifications as are obvious to one of ordinary skill in the art.

What is claimed is:

1. A random access memory having memory locations for storing data words, wherein each data word has N data bits and is uniquely addressable, and wherein a data bit is stored in each memory location, said random access memory comprising:
   means for providing a requested address:
   means for decoding said requested address to identify the requested memory locations corresponding to said requested address and for activating memory locations in response thereto, wherein due to circuit faults the activated memory locations may differ from the requested memory locations;
   a data bus;
   means for transferring data between said activated memory locations and said data bus;
   encoder means responsive to said activated memory locations to provide an activated address identifying the location of said activated memory locations;
   fault detector means for comparing said requested address and said activated address and for indicating an error when said requested address is different from said activated address.

2. The random access memory of claim 1 wherein the encoder means provides a plurality of activated addresses equal to the number of data words activated.

3. A method of accessing a random access memory, including the steps of:
   providing a requested address;
   decoding said requested address to identify the requested memory locations corresponding to said requested address and to activate memory locations in response thereto, wherein due to circuits faults the activated memory location may differ from the requested memory locations;
   transferring data between said activated memory locations and a data bus;

determining the address of said activated memory locations;

comparing said requested address and said activated address;

indicating an error when said requested address is different from said activated address.

4. The method of claim 3 wherein the number of activated addresses is equal to the number of activated data words.

5. An error detector circuit for testing a random access memory having uniquely addressable memory locations for storing data bits, and wherein a data bit is stored in each memory location, said error detector circuit comprising:

means for providing a requested address;

means for decoding said requested address to identify the requested memory locations corresponding to said requested address and for activating the requested memory locations in response thereto wherein due to circuits faults the activated memory locations may differ from the requested memory locations;

a data bus;

means for transferring data between said activated memory locations and said data bus; encoder means responsive to said activated memory locations to provide an activated address identifying the location of said activated memory locations;

detector means for comparing said requested address and said activated address and for indicating an error when said requested address is different from said activated address.

* * * * *